(12) United States Patent
Yamauchi et al.

(10) Patent No.: US 11,617,261 B2
(45) Date of Patent: Mar. 28, 2023

(54) RESIN COMPOSITION, RESIN FILM, METAL FOIL WITH RESIN, PREPREG, METAL-CLAD LAMINATE, AND PRINTED WIRING BOARD

(71) Applicant: Panasonic Intellectual Property Management Co., Ltd., Osaka (JP)

(72) Inventors: Akihiro Yamauchi, Osaka (JP); Eiichiro Saito, Osaka (JP); Kouichi Aoki, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/050,624

(22) PCT Filed: Apr. 22, 2019

(86) PCT No.: PCT/JP2019/016958
§ 371 (c)(1),
(2) Date: Oct. 26, 2020

(87) PCT Pub. No.: WO2019/208476
PCT Pub. Date: Oct. 31, 2019

(65) Prior Publication Data
US 2021/0235580 A1 Jul. 29, 2021

(30) Foreign Application Priority Data

Apr. 27, 2018 (JP) .............................. JP2018-087727

(51) Int. Cl.
| | |
|---|---|
| *B32B 15/08* | (2006.01) |
| *C08J 5/24* | (2006.01) |
| *B32B 15/20* | (2006.01) |
| *C08K 3/26* | (2006.01) |
| *C08K 3/22* | (2006.01) |
| *H05K 1/03* | (2006.01) |
| *C08L 63/00* | (2006.01) |
| *H01L 23/373* | (2006.01) |
| *H05K 7/20* | (2006.01) |

(52) U.S. Cl.
CPC .......... *H05K 1/0373* (2013.01); *B32B 15/08* (2013.01); *B32B 15/20* (2013.01); *C08J 5/244* (2021.05); *C08J 5/249* (2021.05); *C08L 63/00* (2013.01); *H01L 23/3737* (2013.01); *H05K 7/20472* (2013.01); *B32B 2307/206* (2013.01); *B32B 2457/08* (2013.01); *C08K 2003/2227* (2013.01); *C08K 2003/267* (2013.01); *C08K 2201/005* (2013.01); *H05K 2201/0209* (2013.01)

(58) Field of Classification Search
CPC ............ H05K 1/0373; H05K 7/20472; H05K 2201/0209; H05K 3/022; H05K 1/03; H01L 23/3737; B32B 15/08; B32B 15/20; B32B 2307/206; B32B 2260/021; B32B 2260/046; B32B 2262/101; B32B 2307/732; B32B 5/022; B32B 15/14; B32B 2307/538; B32B 2457/08; C08J 5/244; C08J 5/249; C08J 2363/00; C08J 2463/00; C08J 7/0427; C08J 5/24; C08L 63/00; C08L 101/00; C08K 2003/2227; C08K 2003/267; C08K 2201/005; C08K 3/22; C08K 3/26; C08K 9/02
See application file for complete search history.

(56) References Cited

U.S. PATENT DOCUMENTS

| | | | |
|---|---|---|---|
| 2011/0014434 A1* | 1/2011 | Tanaka | H05K 3/0011 428/184 |
| 2011/0135911 A1 | 6/2011 | Maenaka et al. | |
| 2012/0153342 A1 | 6/2012 | Nishimura et al. | |
| 2013/0096233 A1* | 4/2013 | Iwami | C08K 9/02 523/435 |
| 2014/0087614 A1* | 3/2014 | Matsuda | C08K 3/26 442/59 |
| 2017/0099731 A1 | 4/2017 | Arisawa et al. | |

FOREIGN PATENT DOCUMENTS

| | | | |
|---|---|---|---|
| JP | 2006274361 A | * | 10/2006 |
| JP | 2011-016962 | | 1/2011 |
| JP | 2012-087250 | | 5/2012 |
| JP | 2015-199625 | | 11/2015 |
| JP | 2015-207753 | | 11/2015 |
| WO | 2010/016480 | | 2/2010 |
| WO | 2011/155482 | | 12/2011 |

OTHER PUBLICATIONS

Machine translation of JP 2006-274361. (Year: 2006).*
Official Communication issued in International Patent Application No. PCT/JP2019/016958, dated Jul. 23, 2019, along with an English translation thereof.

* cited by examiner

*Primary Examiner* — John D Freeman
(74) *Attorney, Agent, or Firm* — Greenblum & Bernstein, P.L.C.

(57) ABSTRACT

A resin composition includes: a resin as Component (A); and an inorganic filler as Component (B). The Component (B) includes anhydrous magnesium carbonate as Component (b1) and aluminum oxide as Component (b2). Content of the Component (b1) falls within a range from 35% by volume to 65% by volume relative to 100% by volume of the Components (b1) and (b2) combined. Content of the Component (B) falls within a range from 60% by volume to 75% by volume relative to 100% by volume of the resin composition.

15 Claims, 3 Drawing Sheets

FIG. 6B

RESIN COMPOSITION, RESIN FILM, METAL FOIL WITH RESIN, PREPREG, METAL-CLAD LAMINATE, AND PRINTED WIRING BOARD

CROSS-REFERENCE TO RELATED APPLICATIONS

This application is a National Stage of International Application No. PCT/JP2019/016958 filed Apr. 22, 2019, claiming priority to Japanese Patent Application No. 2018-087727 filed on Apr. 27, 2018, the contents of each noted application are hereby incorporated by reference in their entireties.

TECHNICAL FIELD

The present disclosure generally relates to a resin composition, a resin film, a sheet of metal foil with resin, a prepreg, a metal-clad laminate, and a printed wiring board, and more particularly relates to a resin composition containing a resin and an inorganic filler, a resin film, a sheet of metal foil with resin, a prepreg, a metal-clad laminate, and a printed wiring board.

BACKGROUND ART

Patent Literature 1 discloses a thermally conductive resin composition. The thermally conductive resin composition includes two or more inorganic fillers (including at least a first inorganic filler and a second inorganic filler), of which the combined content falls within the range from 60% by mass to 95% by mass. The first inorganic filler has a Mohs hardness of 4 or more, and the second inorganic filler has a Mohs hardness of 3 or less. Also, the ratio of the first inorganic filler to the second inorganic filler falls within the range from 1:1 to 1:0.01.

The thermally conductive resin composition of Patent Literature 1 certainly has improved thermal conductivity but still has room for improvement in the other properties thereof.

CITATION LIST

Patent Literature

Patent Literature 1: JP 2012-087250 A

SUMMARY OF INVENTION

An object of the present disclosure is to provide a resin composition, a resin film, a sheet of metal foil with resin, a prepreg, a metal-clad laminate, and a printed wiring board, each of which has good thermal conductivity, drillability, heat resistance, and formability.

A resin composition according to an aspect of the present disclosure includes: a resin as Component (A); and an inorganic filler as Component (B). The Component (B) includes: anhydrous magnesium carbonate as Component (b1); and aluminum oxide as Component (b2). Content of the Component (b1) falls within a range from 35% by volume to 65% by volume relative to 100% by volume of the Components (b1) and (b2) combined. Content of the Component (B) falls within a range from 60% by volume to 75% by volume relative to 100% by volume of the resin composition.

A resin film according to another aspect of the present disclosure includes a film including either the resin composition described above or a semi-cured product thereof.

A sheet of metal foil with resin according to still another aspect of the present disclosure includes: a resin layer including either the resin composition described above or a semi-cured product thereof; and a sheet of metal foil bonded to the resin layer.

A prepreg according to yet another aspect of the present disclosure includes: a resin layer including either the resin composition described above or a semi-cured product thereof; and a base member buried in the resin layer.

A metal-clad laminate according to yet another aspect of the present disclosure includes: an insulating layer including a cured product of the resin composition described above; and a sheet of metal foil bonded to the insulating layer.

A printed wiring board according to yet another aspect of the present disclosure includes: an insulating layer including a cured product of the resin composition described above; and a conductor layer bonded to the insulating layer.

DESCRIPTION OF EMBODIMENTS

1. Overview

A resin composition according to an exemplary embodiment includes a resin as Component (A) and an inorganic filler as Component (B).

The Component (B) includes anhydrous magnesium carbonate as Component (b1) and aluminum oxide as Component (b2). The Component (b1) has no water of crystallization, and therefore, has high heat resistance. The Component (b2) has even higher heat resistance than the Component (b1). Thus, letting the Component (B) include the Components (b1) and (b2) imparts heat resistance to the resin composition.

The content of the Component (b1) falls within the range from 35% by volume to 65% by volume relative to 100% by volume of the Components (b1) and (b2) combined. The Component (b1) is softer than the Component (b2). The Component (b2) is closer in shape to a sphere than the Component (b1) is. Thus, adjusting the content of the Component (b1) within the range specified above imparts drillability and formability to the resin composition.

The content of the Component (B) falls within the range from 60% by volume to 75% by volume relative to 100% by volume of the resin composition. The Component (B) has higher thermal conductivity than the Component (A). The Component (A) has higher flowability than the Component (B). Thus, adjusting the content of the Component (B) within the range specified above imparts thermal conductivity and formability to the resin composition.

As can be seen from the foregoing description, the resin composition according to this embodiment has good thermal conductivity, drillability, heat resistance, and formability.

2. Details 2.1. Resin Composition

A resin composition according to this embodiment contains a resin as Component (A) and an inorganic filler as Component (B). Optionally, the resin composition may further contain at least one of a curing agent, a catalyst, a flame retardant, a coupling agent, or a dispersant, as long as the advantages of this embodiment are counterbalanced. The resin composition may be in liquid phase or in solid phase at ordinary temperature. In any case, however, the resin composition eventually turns into a cured product when heated. The cured product is a substance that does not dissolve or melt. The resin composition may turn into a cured product through exposure to heat or light by making a transition from Stage A to Stage C via Stage B. Alternatively, the resin composition may also turn into a cured product by making a direct transition from Stage A to Stage C without passing through Stage B. Note that the definitions of Stages A, B, and C are compliant with JIS K6900-1944. In the following description, a substance in Stage B will be hereinafter referred to as a "semi-cured product" and a substance in Stage C will be hereinafter referred to as a "cured product."

2.1.1. Resin as Component (A)

The resin as Component (A) includes at least one of a monomer or a prepolymer. The prepolymer includes an oligomer. The Component (A) may be a thermosetting resin or a photocurable resin, whichever is appropriate. The polymerization reaction of the Component (A) is not particularly limited. Specific examples of the polymerization reaction include chain polymerization and sequential polymerization. A typical example of chain polymerization may be radical polymerization. A typical example of sequential polymerization may be polyaddition.

Specific examples of the Component (A) include: epoxy resins; phenoxy resins; polyimide resins; polyester resins; triazine resins; maleimide resins; polyphenylene ether resins; and polyphenylene ether resins having a functional group with a C—C unsaturated bond per molecule. These resins also include derivatives thereof.

The resin as Component (A) suitably includes at least one of an epoxy resin or a phenoxy resin. The epoxy resin suitably includes a resin containing two or more epoxy rings (oxirane rings) per molecule. The epoxy resin may be in liquid phase or in solid phase, whichever is appropriate.

Specific examples of epoxy resins include: bisphenol epoxy resins; novolac epoxy resins; arylalkylene epoxy resins; naphthalene skeleton modified epoxy resins; trifunctional epoxy resins; phenoxy resins; triphenylmethane epoxy resins; anthracene epoxy resins; dicyclopentadiene epoxy resins; norbornene epoxy resins; fluorene epoxy resins; flame retardant epoxy resins obtained by halogenating any of the above epoxy resins; epoxy resins modified with a phosphorus compound; preliminary reaction products between an epoxy resin and a polyphenylene ether resin; and preliminary reaction products between an epoxy resin and an acid anhydride. Examples of epoxy resins also include derivatives of these resins.

Examples of bisphenol epoxy resins include: bisphenol A epoxy resins; bisphenol F epoxy resins; and bisphenol S epoxy resins. Examples of bisphenol epoxy resins also include derivatives of these resins.

Examples of novolac epoxy resins include phenol novolac epoxy resins and cresol novolac epoxy resins. Examples of novolac epoxy resins also include derivatives of these resins.

Examples of arylalkylene epoxy resins include: biphenyl epoxy resins; xylylene epoxy resins; phenol aralkyl epoxy resins; biphenyl aralkyl epoxy resins; biphenyl novolac epoxy resins; biphenyl dimethylene epoxy resins; trisphenol methane novolac epoxy resins; and tetramethylbiphenyl epoxy resins. Examples of arylalkylene epoxy resins also include derivatives of these resins.

Examples of naphthalene skeleton modified epoxy resin include: naphthalene epoxy resins; naphthalene skeleton modified cresol novolac epoxy resins; naphthalene diol aralkyl epoxy resins; naphthol aralkyl epoxy resins; methoxy naphthalene modified cresol novolac epoxy resins; and methoxy naphthalene dimethylene epoxy resins. Examples of naphthalene skeleton modified epoxy resin also include derivatives of these resins.

The phenoxy resin is a resin obtained by polymerizing a bisphenol A epoxy resin in a normal (or straight) chain form. Adding a phenoxy resin to the Component (A) improves the flexibility of the resin film 1.

The Component (A) suitably includes a liquid resin (such as a liquid epoxy resin). In that case, the content of the liquid resin is suitably equal to or greater than 4 parts by mass, more suitably equal to or greater than 10 parts by mass, relative to 100 parts by mass of all organic components. Setting the content of the liquid resin at 4 parts by mass or more improves the flexibility of the resin film 1. As used herein, "all organic components" refer to the rest of the resin composition other than the inorganic filler as Component (B). The upper limit of the content of the liquid resin is not particularly limited, but is suitably 90 parts by mass or less, more suitably 80 parts by mass or less, relative to 100 parts by mass of all organic components.

2.1.2. Inorganic Filler as Component (B)

The inorganic filler as Component (B) includes: anhydrous magnesium carbonate as Component (b1); and aluminum oxide as Component (b2). The Component (B) suitably further includes, as Component (b3), an inorganic substance on which a molybdenum compound is supported.

Anhydrous magnesium carbonate serving as Component (b1) is magnesium carbonate (anhydride) with no water of crystallization. The Component (b1) is an aggregate of anhydrous magnesium carbonate particles. The particles of anhydrous magnesium carbonate may have a polyhedral shape, for example, and suitably have a rounded shape. In general, magnesium carbonate is present in the form of an anhydrous, dihydrate, trihydrate, or pentahydrate compound. However, anhydrous magnesium carbonate, which is an anhydride, has no water of crystallization, and thus has excellent thermal stability. Therefore, adding the Component (b1) to the Component (B) improves the heat resistance of the resin composition.

Stated the other way around, a hydrate of magnesium carbonate could be a factor causing a decrease in heat resistance. That is why the Component (B) suitably includes substantially no hydrates of magnesium carbonate. As used herein, if something includes "substantially no hydrates," then it means that the hydrates are eliminated intentionally. In other words, the Component (B) may include a very small amount of hydrates as long as the hydrates are inevitably contained impurities.

The anhydrous magnesium carbonate as Component (b1) has a relatively high thermal conductivity for an inorganic substance. Thus, adding the Component (b1) to the Component (B) improves the thermal conductivity of the resin composition.

The anhydrous magnesium carbonate as Component (b1) is a soft crystal, which would reduce the wear of a drill involved with drilling. That is to say, adding the Component (b1) to the Component (B) improves the drillability of the resin composition. Note that the Mors hardness may be used as an index to the hardness of the Component (B).

The anhydrous magnesium carbonate as Component (b1) is suitably subjected to surface treatment with a coupling agent. Subjecting the Component (b1) to surface treatment using a coupling agent in this manner increases the degree of adhesion between the Component (A) which is an organic material and the Component (B) (in particular, Component (b1) in this case) which is an inorganic material. Specific examples of the coupling agent will be enumerated later.

The anhydrous magnesium carbonate as Component (b1) suitably has a mean particle size falling within the range from 8 µm to 20 µm. As used herein, the "mean particle size" refers to a particle size at a cumulative value of 50% in a particle size distribution, i.e., a median diameter (D50). The mean particle size may be measured by laser diffraction and scattering method. Setting the mean particle size of the Component (b1) at 8 µm or more reduces the area of contact between the resin as Component (A) and the Component (b1), thus curbing a decline in thermal conductivity. Setting the mean particle size of the Component (b1) at 20 µm or less allows a decline in the insulation properties of a cured product of the resin composition to be curbed.

The aluminum oxide as Component (b2) is also called "alumina" industrially. The Component (b2) is an aggregate of aluminum oxide particles. The Component (b2) has higher thermal conductivity and higher heat resistance than the Component (b1), thus improving the thermal conductivity and heat resistance of the resin composition.

The shape of aluminum oxide as Component (b2), i.e., the shape of the particles that form the Component (b2), is suitably a rounded shape. As used herein, the "rounded shape" refers to a shape with no pointed protruding portions. The rounded shape includes a spherical shape and a spheroid shape but does not include a plate shape, a polyhedron shape, a rectangular parallelepiped shape, a rod shape, a needle shape, or a scale shape. Making the particles that form the Component (b2) rounded improves the flowability of either a resin composition that is in liquid phase at an ordinary temperature or a resin composition that turns into liquid phase when heated, thus improving the formability (in particular, circuit fillability). As used herein, the "circuit fillability" is an index indicating how easy the gap between adjacent conductor wires may be filled with the resin composition.

The aluminum oxide as the Component (b2) has so high hardness that the mean particle size thereof is suitably as small as possible. Specifically, the mean particle size of the Component (b2) is suitably 1 µm or less. Setting the mean particle size of the Component (b2) at 1 µm or less in this manner allows a decline in the drillability of the resin composition to be curbed. Note that the lower limit of the mean particle size of the Component (b2) is 0.1 µm.

Aluminum oxide as the Component (b2) is suitably subjected to surface treatment with a coupling agent. Subjecting the Component (b2) to surface treatment with a coupling agent in this manner increases the degree of adhesion between the Component (A) which is an organic material and the Component (B) (in particular, Component (b2) in this case) which is an inorganic material. Specific examples of the coupling agent will be enumerated later.

The content of anhydrous magnesium carbonate as the Component (b1) falls within the range from 35% by volume to 65% by volume relative to 100% by volume of the Components (b1) and (b2) combined. Note that the volume of the Component (b1) is the total volume of respective particles themselves that form the Component (b1). Likewise, the volume of the Component (b2) is the total volume of respective particles themselves that form the Component (b2).

Setting the content of anhydrous magnesium carbonate as the Component (b1) at less than 35% by volume would allow the content of the aluminum oxide as the Component (b2) to increase relatively. The Component (b2) has high hardness. Thus, increasing the content of the Component (b2) tends to cause a decline in the drillability of the resin composition.

Setting the content of anhydrous magnesium carbonate as the Component (b1) at more than 65% by volume would allow the content of the aluminum oxide as the Component (b2) to decrease relatively. In a situation where the shape of the Component (b1) (i.e., the shape of its particles) is a non-rounded shape (e.g., a polyhedron shape), increasing the content of the Component (b1) tends to cause a decline in the formability of the resin composition even when the shape of the Component (b2) (i.e., the shape of its particles) is a rounded shape.

The content of the inorganic filler as the Component (B) falls within the range from 60% by volume to 75% by volume relative to 100% by volume of the resin composition (except the solvent). Note that the volume of the Component (B) herein refers to the total volume of respective particles themselves that form the Component (B).

The inorganic filler as the Component (B) has higher thermal conductivity and higher heat resistance than the resin as the Component (A). However, setting the content of the Component (B) at less than 60% by volume allows the content of the Component (A) with lower thermal conductivity and lower heat resistance to increase relatively, thus possibly causing a decline in the thermal conductivity and heat resistance of the resin composition.

The resin as Component (A) has higher flowability at either an ordinary temperature or an elevated temperature than the inorganic filler as the Component (B). However, setting the content of the Component (B) at more than 75% by volume allows the content of the Component (A) with the higher flowability to decrease relatively, thus possibly causing a decline in the formability of the resin composition.

The mean particle size of anhydrous magnesium carbonate as the Component (b1) is suitably larger than the mean particle size of aluminum oxide as the Component (b2). Setting the mean particle sizes of the Components (b1) and (b2) at mutually different values allows the Components (b1) and (b2) added to have higher density than in a situation where these Components (b1) and (b2) have the same mean particle size. This would place the particles that form the Components (b1) and (b2) in proximity to each other, thus making it easier to form a heat conduction path and thereby improving the thermal conductivity of the resin composition. Among other things, it is particularly recommended that the mean particle size of the Component (b1) fall within the range from 8 µm to 20 µm and that the mean particle size of the Component (b2) be 1 µm or less. This would further improve the thermal conductivity of the resin composition.

The inorganic filler as the Component (B) suitably further includes, as Component (b3), an inorganic substance on which a molybdenum compound is supported. The inorganic substance serving as a carrier is an aggregate of inorganic particles. A molybdenum compound is supported on the surface of the respective inorganic particles. In other words, the molybdenum compound adheres to the surface of the respective inorganic particles either entirely or only partially. More specifically, the molybdenum compound may adhere to the entire surface of the respective inorganic particles when the entire surface of the respective inorganic particles is covered with a layer of the molybdenum compound, for example. Meanwhile, the molybdenum compound may adhere to only a part of the surface of the respective inorganic particles when the surface of the inorganic particles is spotted with the molybdenum compound here and there.

The inorganic substance serving as a carrier is not particularly limited. Examples of inorganic substances include carbonates, metal oxides, silicates and metal hydroxides. Specific examples of carbonates include calcium carbonate. Specific examples of metal oxides include zinc oxide. Specific examples of silicates include talc. Specific examples of metal hydroxides include magnesium hydroxide.

The molybdenum compound is not particularly limited. Specific examples of molybdenum compounds include: zinc molybdate; calcium molybdate; magnesium molybdate; molybdenum trioxide; ammonium molybdate; barium molybdate; sodium molybdate; potassium molybdate; phosphomolybdic acid; ammonium phosphomolybdate; sodium phosphomolybdate; silico molybdic acid; molybdenum boride; molybdenum disilicide; molybdenum nitride; and molybdenum carbide. Among other things, zinc molybdate, calcium molybdate, and magnesium molybdate are particularly suitable from the viewpoints of chemical stability, moisture resistance, and insulation properties.

Further adding the Component (b3) to the inorganic filler as the Component (B) further improves the drillability of the resin composition because the molybdenum compound is supported on the inorganic substance. Among other things, talc is softest among the inorganic substances serving as carriers. Thus, adding talc on which a molybdenum compound is supported as the Component (b3) further improves the drillability of the resin composition.

If the inorganic filler as the Component (B) further includes the Component (b3), then the content of the Component (b3) is suitably 10% by volume or less relative to 100% by volume of the Components (b1), (b2), and (b3) combined. The heat resistance of the Component (b3) may be lower than that of the Components (b1) and (b2). Thus, setting the content of the Component (b3) at 10% by volume or less allows a decline in the heat resistance of the resin composition to be curbed. Note that the volume of the Component (b3) is the total volume of respective particles themselves that form the Component (b3).

2.1.3. Curing Agent

If the resin as the Component (A) includes at least one of an epoxy resin or a phenoxy resin, then the resin composition suitably further includes a curing agent. The curing agent may be, but does not have to be, selected from the group consisting of: dicyandiamide; a phenolic resin; phosphorus-containing phenolic resin; acid anhydride; and cyanate ester. Among other things, dicyandiamide is particularly suitable from the viewpoint of the flexibility of the resin film 1.

The phenolic resin may be any phenolic resin without limitation, as long as the resin contains two or more hydroxyl groups per molecule.

The phosphorus-containing phenolic resin may be any phenolic resin without limitation, as long as the resin contains two or more hydroxyl groups and one or more phosphorus atoms per molecule. Further adding the phosphorus-containing phenolic resin as a curing agent to the resin composition improves the flame retardancy of the resin composition.

The total content of the phenolic resin and the phosphorus-containing phenolic resin is suitably 40 parts by mass or less, more suitably 30 parts by mass or less, relative to 100 parts by mass of all organic components from the viewpoint of the flexibility.

2.1.4. Catalyst

If the resin composition contains a curing agent, then resin composition suitably further contains a catalyst. The catalyst may promote the reaction between the Component (A) and the curing agent. Any catalyst may be used without limitation. Examples of catalysts include organic acid metal salts (such as metal soaps), tertiary amines, and imidazoles.

Examples of metal salts of organic acids include metal salts such as Zn, Cu, and Fe of organic acids such as octanoic acid, stearic acid, acetylacetonate, naphthenic acid, salicylic acid, and octylic acid. An example of a metal salt of an organic acid may be zinc octylate (bis(2-ethylhexanoic acid) zinc).

Tertiary amine includes triethylamine and triethanolamine.

The imidazoles include 2-ethyl-4-methylimidazole and 4-methylimidazole.

Among other things, a metal salt of an organic acid (such as zinc octylate, in particular) is suitable, considering that a metal salt of an organic acid may impart higher heat resistance to the resin composition.

2.1.5. Flame Retardant

Any flame retardant may be used without limitation. The flame retardant may be an organic flame retardant or an inorganic flame retardant, whichever is appropriate.

Specific examples of organic flame retardants include halogen compounds and phosphorus compounds. The phosphorus compounds include: a phosphate ester flame retardant; a phosphazene flame retardant; a bisdiphenylphosphine oxide flame retardant; and a phosphinate flame retardant. The phosphate ester flame retardants include a condensed phosphate ester of dixylenyl phosphate. The phosphazene flame retardants include phenoxyphosphazene. The bisdiphenylphosphine oxide flame retardants include xylylene bisdiphenylphosphine oxide. The phosphinate flame retardants include a phosphinic acid metal salt of a dialkylphosphinic acid aluminum salt.

Specific examples of inorganic flame retardants include metal hydroxides.

Further adding a flame retardant to the resin composition improves the flame retardancy of the resin composition.

2.1.6. Coupling Agent

Any coupling agent may be used without limitation as long as the coupling agent includes, in a molecule, a reactive group to chemically bond to an inorganic material and a reactive group to chemically bond to an organic material. Specific examples of the reactive group to chemically bond to an inorganic material include an ethoxy group and a methoxy group. Specific examples of the reactive group to chemically bond to an organic material include an epoxy group, an amino group, an isocyanate group, a hydroxy group, a phenolic hydroxy group, and an acid anhydride group.

The coupling agent includes a silane coupling agent. The silane coupling agent may include, for example, epoxy silane, amino silane, isocyanate silane, and acid anhydride silane. Specific examples of epoxy silanes include 3-glycidoxypropyltrimethoxy silane and 3-glycidoxypropyltriethoxy silane. Specific examples of amino silane include 3-aminopropyltriethoxy silane. Specific examples of isocyanate silane include 3-isocyanatepropyltriethoxy silane.

Further adding the coupling agent to the resin composition increases the degree of adhesion between the organic material and the inorganic material.

2.1.7. Dispersant

The dispersant is a type of a surfactant and is not particularly limited. Further adding a dispersant to the resin composition allows the Component (B) to be dispersed uniformly.

2.1.8. Method for Preparing Resin Composition

A resin composition according to this embodiment may be prepared by blending a resin as Component (A) and an inorganic filler as Component (B) together and adding, as needed, at least one of a curing agent, a flame retardant, a catalyst, a coupling agent, or a dispersant to the blend. If the Component (A) is in solid phase at an ordinary temperature, then a solvent is suitably further added to the blend. Any solvent may be used without limitation, as long as the solvent is able to dissolve at least the Component (A). For example, methyl ethyl ketone may be used as the solvent. Nevertheless, if the Component (A) is in liquid phase at an ordinary temperature, then there is no need to further add any solvent to the blend.

Before the resin as the Component (A) and the inorganic filler as the Component (B) are blended together, the Component (B) may be subjected to surface treatment with a coupling agent. The surface treatment may be a wet treatment or a dry treatment, whichever is appropriate.

When the Component (A) and the Component (B) are blended together, a coupling agent may be added. Such a method is called an "integral blending method." Preparing a resin composition by the integral blending method and manufacturing a sheet of metal foil 2 with resin, a metal-clad laminate 4, and a printed wiring board 5 by using the resin composition would achieve the following advantages. Specifically, this would increase the degree of adhesion between a resin layer 20 and a sheet of metal foil 21 of the sheet of metal foil 2 with resin, the degree of adhesion between an insulating layer 40 and a sheet of metal foil 41 of the metal-clad laminate 4, and the degree of adhesion between an insulating layer 50 and a conductor layer 51 of the printed wiring board 5.

The resin composition thus prepared exhibits good thermal conductivity, drillability, heat resistance, and formability.

2.2. Resin Film

Figure 1:
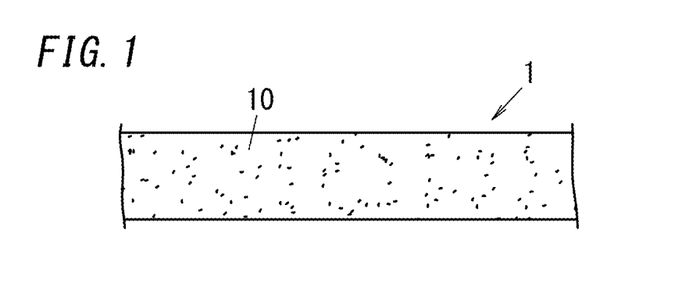
FIG. 1 is a schematic cross-sectional view of a resin film according to an exemplary embodiment of the present disclosure.

A resin film 1 according to this embodiment includes a film 10 including either the resin composition or a semi-cured product thereof as shown in FIG. 1.

As used herein, the film 10 including the resin composition refers to a film in which the Component (A) contained in the resin composition undergoes chain polymerization (such as radical polymerization). That is to say, in that case, the resin film 1 is not in Stage B from the beginning but makes transition to Stage C to turn into a cured product through exposure to heat or light.

On the other hand, the film 10 including a semi-cured product of the resin composition herein refers to a film in which the Component (A) contained in the resin composition undergoes sequential polymerization (such as polyaddition). That is to say, in that case, the resin film 1 is in Stage B from the beginning and makes transition to Stage C to turn into a cured product through exposure to heat.

The resin film 1 may be formed by, for example, applying a liquid resin composition onto a supporting film (not shown) and then drying the liquid resin composition to remove the solvent from the resin composition or heating the resin composition to turn the resin composition into a semi-cured product. The resin film 1 is used by being peeled off the supporting film. A specific example of the supporting film may be a polyethylene terephthalate (PET) film.

Figure 4:
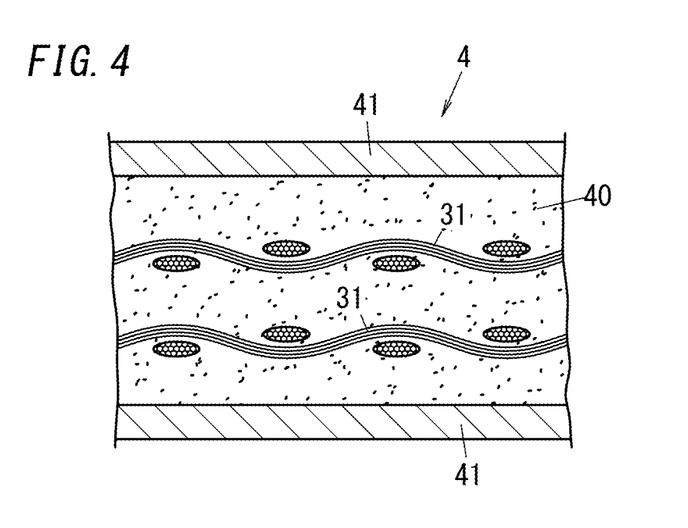
FIG. 4 is a schematic cross-sectional view of a metal-clad laminate according to an exemplary embodiment of the present disclosure.
Figure 5:
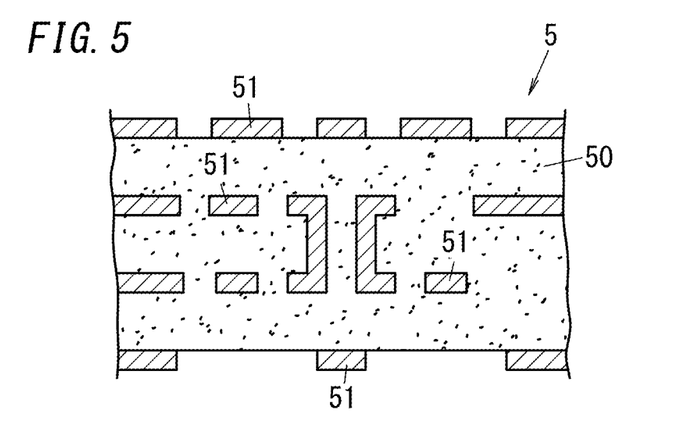
FIG. 5 is a schematic cross-sectional view of a printed wiring board according to an exemplary embodiment of the present disclosure.

The cured product of the resin film 1 may form the insulating layer 40 of the metal-clad laminate 4 and the insulating layer 50 of the printed wiring board 5, for example.

The thickness of the resin film 1 is not particularly limited but may fall within the range from 50 μm to 200 μm, for example.

The resin film 1 includes the resin composition according to this embodiment, and therefore, exhibits good thermal conductivity, drillability, heat resistance, and formability.

2.3. Sheet of Metal Foil with Resin

Figure 2:
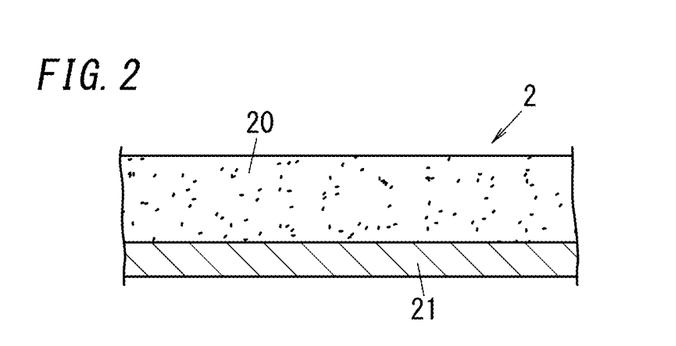
FIG. 2 is a schematic cross-sectional view of a sheet of metal foil with resin according to an exemplary embodiment of the present disclosure.

A sheet of metal foil 2 with resin according to this embodiment includes a resin layer 20 and a sheet of metal foil 21 as shown in FIG. 2. The resin layer 20 includes either the resin composition or a semi-cured product thereof. The sheet of metal foil 21 is bonded to the resin layer 20.

As used herein, a situation where the resin layer 20 includes the resin composition refers to a situation where the Component (A) undergoes chain polymerization (such as radical polymerization). That is to say, in that case, the resin layer 20 is not in Stage B from the beginning but makes transition to Stage C to turn into a cured product through exposure to heat or light.

On the other hand, a situation where the resin layer 20 includes a semi-cured product of the resin composition herein refers to a situation where the Component (A) undergoes sequential polymerization (such as polyaddition). That is to say, in that case, the resin layer 20 is in Stage B from the beginning and makes transition to Stage C to turn into a cured product through exposure to heat.

The sheet of metal foil 2 with resin may be formed by, for example, applying a liquid resin composition onto the sheet of metal foil 21 and then drying the liquid resin composition to remove the solvent from the resin composition or heating the resin composition to turn the resin composition into a semi-cured product.

The cured product of the resin layer 20 of the sheet of metal foil 2 with resin may form the insulating layer 40 of the metal-clad laminate 4 and the insulating layer 50 of the printed wiring board 5, for example.

The sheet of metal foil 2 with resin includes the resin composition according to this embodiment, and therefore, exhibits good thermal conductivity, drillability, heat resistance, and formability.

2.4. Prepreg

Figure 3:
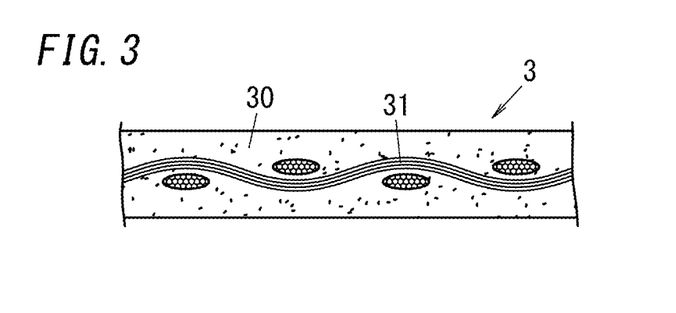
FIG. 3 is a schematic cross-sectional view of a prepreg according to an exemplary embodiment of the present disclosure.

A prepreg 3 according to this embodiment includes a resin layer 30 and a base member 31 as shown in FIG. 3. The resin layer 30 includes either the resin composition or a semi-cured product thereof. The base member 31 is buried in the resin layer 30. Optionally, at least part of the base member 31 may be exposed out of the resin layer 30.

As used herein, a situation where the resin layer 30 includes the resin composition refers to a situation where the Component (A) undergoes chain polymerization (such as radical polymerization). That is to say, in that case, the prepreg 3 is not in Stage B from the beginning but makes transition to Stage C to turn into a cured product through exposure to heat or light.

On the other hand, a situation where the resin layer 30 includes a semi-cured product of the resin composition herein refers to a situation where the Component (A) undergoes sequential polymerization (such as polyaddition). That is to say, in that case, the prepreg 3 is in Stage B from the beginning and makes transition to Stage C to turn into a cured product through exposure to heat.

The prepreg 3 may be formed by, for example, impregnating the base member 31 with a liquid resin composition and then drying the liquid resin composition to remove the solvent from the resin composition or heating the resin composition to turn the resin composition into a semi-cured product. A specific example of the base member 31 may be a piece of glass cloth.

The cured product of the prepreg 3 may form the insulating layer 40 of the metal-clad laminate 4 and the insulating layer 50 of the printed wiring board 5, for example.

The prepreg 3 includes the resin composition according to this embodiment, and therefore, exhibits good thermal conductivity, drillability, heat resistance, and formability.

2.5. Metal-Clad Laminate

A metal-clad laminate 4 according to this embodiment includes an insulating layer 40 and sheets of metal foil 41 as shown in FIG. 4. The insulating layer 40 includes a cured product of the resin composition. The sheets of metal foil 41 are bonded to the insulating layer 40.

A specific example of the sheets of metal foil 41 may be sheets of copper foil. The thickness of the sheets of metal foil 41 is not particularly limited but suitably falls within the range from 12 µm to 420 µm, and more suitably falls within the range from 18 µm to 210 µm. The ten-point average roughness Rzjis of the sheets of metal foil 41 is not particularly limited, either, but is suitably 3 µm or more, and more suitably 5 µm or more. Setting the ten-point average roughness Rzjis of the sheets of metal foil 41 at 3 µm or more increases the degree of adhesion between the insulating layer 40 and the sheets of metal foil 41 more significantly.

The metal-clad laminate 4 may be formed by, for example, laying at least one sheet of metal foil 41 on top of either or both surfaces of a single prepreg 3 or a multilayer stack of two or more prepregs 3 and applying heat and pressure thereto, for example. Before the sheets of metal foil 41 are laid on top of the multilayer stack, the surfaces of the sheets of metal foil 41 (at least the surfaces to be laid on the prepreg 3) are treated with a coupling agent. Subjecting the sheets of metal foil 41 to surface treatment with a coupling agent in this manner allows the coupling agent to couple the organic material in the prepreg 3 to the sheets of metal foil 41, thus further increasing the degree of adhesion between the insulating layer 40 and the sheets of metal foil 41. Any of the exemplary coupling agents described above may be used as the coupling agent. The condition for applying heat and pressure is not particularly limited. FIG. 4 illustrates a metal-clad laminate 4 in which two base members 31 are buried in the insulating layer 40.

The metal-clad laminate 4 includes the resin composition according to this embodiment, and therefore, exhibits good thermal conductivity, drillability, and heat resistance.

2.6. Printed Wiring Board

A printed wiring board 5 according to this embodiment includes an insulating layer 50 and conductor layers 51 as shown in FIG. 5. The insulating layer 50 includes a cured product of the resin composition. The conductor layers 51 are bonded to the insulating layer 50. As used herein, the conductor layers 51 refer to layers with electrical conductivity such as a signal layer, a power supply layer, and a ground layer. Note that the printed wiring board 5 is a concept encompassing a multilayer printed wiring board with three or more conductor layers 51. Specifically, FIG. 5 illustrates a multilayer printed wiring board including four conductor layers 51.

The printed wiring board 5 may be formed by, for example, applying the subtractive method to the metal-clad laminate 4 as a material. Optionally, the printed wiring boards 5 may be laid one on top of another by the buildup method.

The printed wiring board 5 includes the resin composition according to this embodiment, and therefore, exhibits good thermal conductivity, drillability, and heat resistance.

Examples

Next, the present disclosure will be described specifically by way of illustrative examples. Note that these are only examples of the present disclosure and should not be construed as limiting.

[Materials]

The following were used as materials for resin compositions according to specific examples and comparative examples.

(Resin as Component (A))
  Bisphenol A liquid epoxy resin, product number "850-S," manufactured by DIC Corporation;
  Naphthalene epoxy resin, product number "HP-4710," manufactured by DIC Corporation;
  Naphthalene liquid epoxy resin, product number "HP-4032D," manufactured by DIC Corporation;
  Trifunctional epoxy resin, product number "VG3101L," manufactured by Printec Corporation; and
  Phenoxy resin, product number "YP-50," manufactured by Nippon Steel & Sumitomo Metal Chemical Corporation.

(Inorganic Filler as Component (B))
(Anhydrous Magnesium Carbonate as Component (b1))
  Synthetic magnesite, product name "MSL," manufactured by Konoshima Co., Ltd., mean particle size: 8 µm, polyhedral shape (Aluminum Oxide as Component (b2))
  High-purity synthetic spherical "alumina," product number "AO-502," manufactured by Admatechs, mean particle size: 0.7 µm, spherical shape;
  Alumina, product number "AES-11C," manufactured by Sumitomo Chemical Co., Ltd., mean particle size: 0.39 µm, rounded shape; and
  Calcium zinc molybdate compound, product name "Kemgard 911A," manufactured by Huber Co., Ltd., mean particle size 2.7 µm.

(Other Inorganic Fillers)
  Magnesium carbonate (hydrate), product number "GP-30," manufactured by Konoshima Co., Ltd., mean particle size: 6 µm.

(Curing Agents)
  Dicyandiamide, also known as "DICY";
  Phosphorus-containing phenolic resin, product number "XZ-92741," manufactured by Dow Chemical Company; and Phenolic resin, product number "MEH-7600-4H," manufactured by Meiwa Plastics Industries, Ltd.

(Flame Retardant)

Phosphate ester, product number "PX-200," manufactured by Daihachi Chemical Industry Co., Ltd.

(Catalyst)

Zinc octylate (bis(2-ethylhexanoic acid) zinc), product name "Zn-OCTOATE 20% T," manufactured by DIC Corporation.

(Coupling Agent)

3-glycidoxypropyltrimethoxy silane, product number "A-187," manufactured by Momentive Performance Materials Japan LLC; and 3-glycidoxypropyltriethoxy silane, product number "A-1871," manufactured by Momentive Performance Materials Japan LLC.

(Dispersant)

Wetting and dispersing agent, product number "BYK-W903," manufactured by BYK Japan KK.

[Resin Composition]

These materials were blended together to have the compositions shown in the following Tables 1 and 2. Next, the blend was dissolved or dispersed in methyl ethyl ketone and dimethylformamide as solvents so that the solid content would be 80% by mass to 95% by mass, and then was stirred up with a planetary mixer, thereby preparing varnishes, each containing a resin composition according to one of the specific examples and comparative examples.

TABLE 1

| | | | | Specific gravity | Examples 1 | 2 | 3 | 4 | 5 | 6 | 7 | 8 |
|---|---|---|---|---|---|---|---|---|---|---|---|---|
| (Resin composition (parts by mass) | (A) Resin | | Bisphenol A liquid epoxy resin | 850-S | 1.2 | 16.5 | 16.5 | 16.5 | 16.5 | 16.5 | 16.5 | 16.5 | 16.5 |
| | | | Naphthalene epoxy resin | HP-4710 | 1.2 | 50.5 | 50.5 | 50.5 | 50.5 | 50.5 | 50.5 | 50.5 | 50.5 |
| | | | Naphthalene liquid epoxy resin | HP-4032D | 1.2 | 0 | 0 | 0 | 0 | 0 | 0 | 0 | 0 |
| | | | Trifunctional epoxy resin | VG3101L | 1.2 | 0 | 0 | 0 | 0 | 0 | 0 | 0 | 0 |
| | | | Phenoxy resin | YP-50 | 1.2 | 12.4 | 12.4 | 12.4 | 12.4 | 12.4 | 12.4 | 12.4 | 12.4 |
| | (B) Inorganic filler | (b1) | Synthetic magnesite | MSL (8 μm, polyhedral) | 3.0 | 362.4 | 346.8 | 362.4 | 255.4 | 468.0 | 219.2 | 490.0 | 362.3 |
| | | (b2) | Aluminum oxide | AO-502 (0.7 μm, spherical) | 4.0 | 472.6 | 452.2 | 0 | 617.6 | 328.0 | 285.8 | 639.0 | 462.2 |
| | | | | AES-11C (0.39 μm, rounded) | 4.0 | 0 | 0 | 472.6 | 0 | 0 | 0 | 0 | 0 |
| | | (b3) | Calcium zinc molybdate compound | Kemgard 911A (2.7 μm) | 3.0 | 0 | 0 | 0 | 0 | 0 | 0 | 0 | 7.5 |
| | | Others | Magnesium carbonate (hydrate) | GP-30 (6 μm) | 3.0 | 0 | 0 | 0 | 0 | 0 | 0 | 0 | 0 |
| | Curing agent | | Dicyandiamide | DICY | 1.2 | 3.2 | 3.2 | 3.2 | 3.2 | 3.2 | 3.2 | 3.2 | 3.2 |
| | | | Phosphorus-containing phenolic resin | XZ-92741 | 1.2 | 0 | 0 | 0 | 0 | 0 | 0 | 0 | 0 |
| | | | Phenolic resin | MEH-7600-4H | 1.2 | 0 | 0 | 0 | 0 | 0 | 0 | 0 | 0 |
| | Flame retardant | | Phosphate ester | PX-200 | 1.3 | 16.5 | 16.5 | 16.5 | 16.5 | 16.5 | 16.5 | 16.5 | 16.5 |
| | Catalyst | | Zinc octylate | Zn-OCTOATE 20%T | 1.0 | 0.83 | 0.83 | 0.83 | 0.83 | 0.83 | 0.83 | 0.83 | 0.83 |
| | Coupling agent | | 3-glycidoxypropyltrimethoxy silane | A-187 | 1.1 | 4.2 | 0 | 4.2 | 4.4 | 4.0 | 2.5 | 5.6 | 4.2 |
| | | | 3-glycidoxypropyltriethoxy silane | A-1871 | 1.1 | 8.4 | 8.0 | 8.4 | 8.7 | 8.0 | 5.1 | 11.3 | 8.3 |
| | Dispersant | | Wetting and dispersing agent | BYK-W903 | 1.0 | 3.3 | 3.2 | 3.3 | 3.5 | 3.2 | 2.0 | 4.5 | 3.3 |

TABLE 1-continued

|  |  |  |  |  | Examples | | | | | | |
| --- | --- | --- | --- | --- | --- | --- | --- | --- | --- | --- | --- |
|  |  |  |  |  | 9 | 10 | 11 | 12 | 13 | 14 | 15 |
| (Resin composition (parts by mass) | (A) Resin |  | Bisphenol A liquid epoxy resin | 850-S | 165 | 16.5 | 16.5 | 16.5 | 19.8 | 4.1 | 16.5 |
|  |  |  | Naphthalene epoxy resin | HP-4710 | 50.5 | 50.5 | 0 | 0 | 24.7 | 62.8 | 62.2 |
|  |  |  | Naphthalene liquid epoxy resin | HP-4032D | 0 | 0 | 50.0 | 0 | 0 | 0 | 0 |
|  |  |  | Trifunctional epoxy resin | VG3101L | 0 | 0 | 0 | 50.9 | 0 | 0 | 0 |
|  |  |  | Phenoxy resin | YP-50 | 12.4 | 12.4 | 12.4 | 12.4 | 14.9 | 12.4 | 0 |
|  | (B) Inorganic filler | (b1) | Synthetic magnesite | MSL (8 μm, polyhedral) | 361.7 | 361.2 | 362.4 | 362.4 | 362.4 | 362.4 | 362.4 |
|  |  | (b2) | Aluminum oxide | AO-502 (0.7 μm, spherical) | 423.6 | 375.7 | 472.6 | 472.6 | 472.6 | 472.6 | 472.6 |
|  |  |  |  | AES-11C (0.39 μm, rounded) | 0 | 0 | 0 | 0 | 0 | 0 | 0 |
|  |  | (b3) | Calcium zinc molybdate compound | Kemgard 911A (2.7 μm) | 35.7 | 71.1 | 0 | 0 | 0 | 0 | 0 |
|  |  | Others | Magnesium carbonate (hydrate) | GP-30 (6 μm) | 0 | 0 | 0 | 0 | 0 | 0 | 0 |
|  | Curing agent |  | Dicyandiamide | DICY | 3.2 | 3.2 | 3.7 | 2.8 | 0 | 3.3 | 3.9 |
|  |  |  | Phosphorus-containing phenolic resin | XZ-92741 | 0 | 0 | 0 | 0 | 14.9 | 0 | 0 |
|  |  |  | Phenolic resin | MEH-7600-4H | 0 | 0 | 0 | 0 | 24.9 | 0 | 0 |
|  | Flame retardant |  | Phosphate ester | PX-200 | 16.5 | 16.5 | 16.5 | 16.5 | 0 | 16.5 | 16.5 |
|  | Catalyst |  | Zinc octylate | Zn-OCTOATE 20%T | 0.83 | 0.83 | 0.83 | 0.83 | 0.99 | 0.83 | 0.83 |
|  | Coupling agent |  | 3-glycidoxypropyltrimethoxysilane | A-187 | 4.1 | 4.0 | 4.2 | 4.2 | 4.2 | 4.2 | 4.2 |
|  |  |  | 3-glycidoxypropyltriethoxysilane | A-1871 | 8.2 | 8.1 | 8.4 | 8.4 | 8.4 | 8.4 | 8.4 |
|  | Dispersant |  | Wetting and dispersing agent | BYK-W903 | 3.3 | 3.2 | 3.3 | 3.3 | 3.3 | 3.3 | 3.3 |

TABLE 2

|  |  |  |  |  | Specific gravity | Comparative Examples | | | | | | |
| --- | --- | --- | --- | --- | --- | --- | --- | --- | --- | --- | --- | --- |
|  |  |  |  |  |  | 1 | 2 | 3 | 4 | 5 | 6 | 7 |
| (Resin composition (parts by mass) | (A) Resin |  | Bisphenol A liquid epoxy resin | 850-S | 1.2 | 16.5 | 16.5 | 16.5 | 16.5 | 16.5 | 16.5 | 16.5 |
|  |  |  | Naphthalene epoxy resin | HP-4710 | 1.2 | 50.5 | 50.5 | 50.5 | 50.5 | 50.5 | 50.5 | 50.5 |
|  |  |  | Naphthalene liquid epoxy resin | HP-4032D | 1.2 | 0 | 0 | 0 | 0 | 0 | 0 | 0 |
|  |  |  | Trifunctional epoxy resin | VG3101L | 1.2 | 0 | 0 | 0 | 0 | 0 | 0 | 0 |
|  |  |  | Phenoxy resin | YP-50 | 1.2 | 12.4 | 12.4 | 12.4 | 12.4 | 12.4 | 12.4 | 12.4 |
|  | (B) Inorganic filler | (b1) | Synthetic magnesite | MSL (8 μm, polyhedral) | 3.0 | 0 | 219.7 | 502.7 | 0 | 709.0 | 174.9 | 709.6 |
|  |  | (b2) | Aluminum | AO-502 (0.7 μm, spherical) | 4.0 | 452.2 | 666.3 | 280.3 | 966.0 | 0 | 228.1 | 925.4 |

TABLE 2-continued

| | | | Specific gravity | Comparative Examples | | | | | | |
|---|---|---|---|---|---|---|---|---|---|---|
| | | | | 1 | 2 | 3 | 4 | 5 | 6 | 7 |
| | oxide | AES-11C (0.39 µm, rounded) | 4.0 | 0 | 0 | 0 | 0 | 0 | 0 | 0 |
| (b3) | Calcium zinc molybdate compound | Kemgard 911A (2.7 µm) | 3.0 | 0 | 0 | 0 | 0 | 0 | 0 | 0 |
| Others | Magnesium carbonate (hydrate) | GP-30 (6 µm) | 3.0 | 346.8 | 0 | 0 | 0 | 0 | 0 | 0 |
| Curing agent | Dicyandiamide | DICY | 1.2 | 3.2 | 3.2 | 3.2 | 3.2 | 3.2 | 3.2 | 3.2 |
| | Phosphorus-containing phenolic resin | XZ-92741 | 1.2 | 0 | 0 | 0 | 0 | 0 | 0 | 0 |
| | Phenolic resin | MEH-7600-4H | 1.2 | 0 | 0 | 0 | 0 | 0 | 0 | 0 |
| Flame retardant | Phosphate ester | PX-200 | 1.3 | 16.5 | 16.5 | 16.5 | 16.5 | 16.5 | 16.5 | 16.5 |
| Catalyst | Zinc octylate | Zn-OCTOATE 20%T | 1.0 | 0.83 | 0.83 | 0.83 | 0.83 | 0.83 | 0.83 | 0.83 |
| Coupling agent | 3-glycidoxy-propyltrimethoxy silane | A-187 | 1.1 | 0 | 4.4 | 3.9 | 4.8 | 3.5 | 2.0 | 8.2 |
| | 3-glycidoxy-propyltriethoxy silane | A-1871 | 1.1 | 8.0 | 8.9 | 7.8 | 9.7 | 7.1 | 4.0 | 16.4 |
| Dispersant | Wetting and dispersing agent | BYK-W903 | 1.0 | 3.2 | 3.5 | 3.1 | 3.9 | 2.8 | 1.6 | 6.5 |

[Resin Film]

A resin film was formed by applying the varnish described above onto a PET film as a supporting film and then heating the PET film coated with the varnish at about 150° C. for 4 to 5 minutes to turn the resin composition into a semi-cured product.

[Prepreg]

A prepreg was formed by using a piece of glass cloth (#7628 manufactured by Nanya) as a base member, impregnating the piece of glass cloth with the varnish at room temperature, and then heating the glass cloth impregnated with the varnish at about 150° C. for 4 to 5 minutes using a noncontact type heating unit to dry and remove the solvent from the varnish and turn the resin composition into a semi-cured product. The resin content of the prepreg was adjusted to 50% by mass.

[Copper-Clad Laminate]

A copper-clad laminate (CCL), of which the insulating layer had an overall thickness of 800 µm, was formed by subjecting an assembly in which four prepregs obtained as described above were sandwiched between roughened surfaces of two sheets of copper foil (each having a thickness of 35 µm) to a forming process with the assembly heated at 195° C. for 90 minutes under a pressure of 2.94 MPa (30 kgf/cm$^2$) applied thereto.

[Evaluation Tests]

(Flexibility)

The resin film was wound around a SUS bar with a diameter of 10 mm and a SUS bar with a diameter of 100 mm to check, with the eye, how many cracks were observed on the resin film. The bending angle when the resin film was wound was set at 180 degrees. Evacuation was made based on the following criteria:

Grade A: when cracks were detected on neither the film wound around the bar with a diameter of 10 mm nor the film wound around the bar with a diameter of 100 mm;

Grade B: when cracks were detected on the film wound around the bar with a diameter of 10 mm but no cracks were detected on the film wound around the bar with a diameter of 100 mm; and Grade C: when cracks were detected on both the film wound around the bar with a diameter of 10 mm and the film wound around the bar with a diameter of 100 mm.

(Formability)

Printed wiring boards were obtained by forming conductor wiring with a grid pattern on each of the sheets of copper foil on both surfaces of a copper-clad laminate (product number R-1566 manufactured by Panasonic Corporation) such that 20%, 50%, and 80% of the copper foil would remain (such percentages of copper remaining will be hereinafter referred to as "residual copper ratios") there, respectively. A sheet of the resin film was laid on top of each of the conductor wiring patterns on both surfaces of each of these printed wiring boards and was heated at 200° C. for 60 minutes under a pressure of 2.94 MPa (30 kgf/cm$^2$) applied thereto, thereby obtaining a multilayer stack. Then, the multilayer stack was inspected, with the eye, to see if there were any voids there. The printed wiring boards with the respective residual copper ratios were evaluated based on the following criteria:

Grade A: when no voids were detected; and

Grade B: when any voids were detected.

(Thermal Conductivity)

The thermal diffusivity ($\alpha$) of the copper-clad laminate was measured by laser flash method. The specific heat (Cp) of the copper-clad laminate was measured by DSC (Differential Scanning calorimetry) method. Furthermore, the density ($\rho$) of the copper-clad laminate was measured by underwater replacement method. Based on these measured values, the thermal conductivity ($\lambda$) was calculated by the following equation:

$$\lambda(W/m \cdot K) = \alpha(m^2/s) \times Cp(J/kg \cdot K) \times \rho(kg/m^3)$$

(Drillability)

Two copper-clad laminates obtained as described above were stacked one on top of the other. The stack of the copper-clad laminates was sandwiched between an entry board and a backup board, and then was drilled with a drill bit attached to a drill machine. Drilling was performed under the following condition:

Entry board: aluminum plate (with a thickness of 0.15 mm);
Backup board: Bakelite board (with a thickness of 1.6 mm);
Drill bit: "NHU-L020," manufactured by Union Tool Co. (with a blade diameter of 0.3 mm and a blade length of 5.5 mm);
Number of revolutions: 160,000 rpm;
Feed rate: 3.2 m/min;
Chip load: 20 μm/rev; and
Number of hits: 3,000

Then, the drill wear rate (W) was calculated by the following equation:

$$W = (S1 - S2) \times 100 / S1$$

S1: the area of a blade part before drilling; and
S2: the area of the blade part after drilling.

Figure 6A:
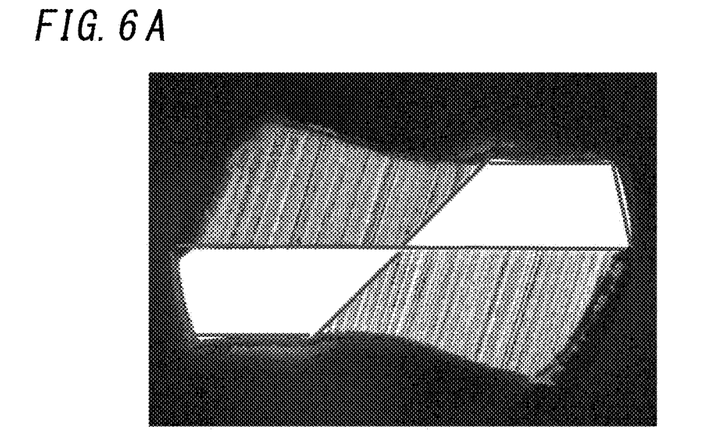
FIG. 6A is a photograph showing a tip of a drill bit yet to be used in drilling.
Figure 6B:
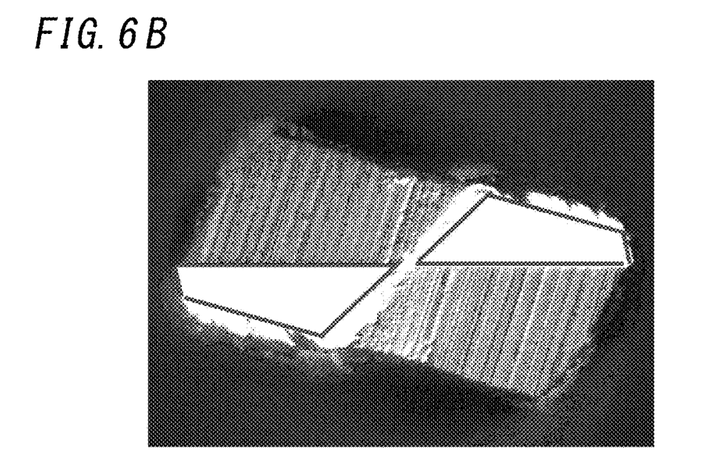
FIG. 6B is an exemplary photograph showing the tip of the drill bit that has been used in the drilling.

The blade part is a part directly contributing to cutting. The area of the blade portion is obtained from an image captured by shooting the drill bit from over its tip. FIG. 6A is a photograph of the tip of the drill bit before drilling. S1 is the area of a portion surrounded with the solid lines in FIG. 6A. FIG. 6B is a photograph of the tip of the drill bit after drilling. S2 is the area of a portion surrounded with the solid lines in FIG. 6B.

(Heat Resistance)

The copper-clad laminate was cut out into a plurality of samples, each having dimensions of 5 cm square. These samples were loaded into an oven at 250° C. and an oven at 270° C. for one hour each. Then, each of these samples was checked, with the eye, to see if there was any swelling. As used herein, "swelling" refers to locally raised peeling caused either between the insulating layers of each sample or between an insulating layer thereof and a sheet of copper foil and is a form of interlayer peeling. Evaluation was made based on the following criteria:

Grade A: when no swelling was detected at 250° C. or 270° C.;
Grade B: when no swelling was detected a 250° C. but some swelling was detected at 270° C.; and
Grade C: when swelling was detected at both 250° C. and 270° C.

These test results are summarized in the following Tables 3 and 4:

TABLE 3

| | | Examples | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 |
| Content of Component (B) in resin composition | % by volume | 70 | 70 | 70 | 70 | 70 | 60 | 75 | 70 | 70 | 70 | 70 | 70 | 70 | 70 | 70 |
| Content of Component (b1) in Component (B) | % by volume | 50 | 50 | 50 | 35 | 65 | 50 | 50 | 50 | 50 | 50 | 50 | 50 | 50 | 50 | 50 |
| Content of Component (b2) in Component (B) | % by volume | 50 | 50 | 50 | 65 | 35 | 50 | 50 | 49 | 45 | 40 | 50 | 50 | 50 | 50 | 50 |
| Content of Component (b3) in Component (B) | % by volume | 0 | 0 | 0 | 0 | 0 | 0 | 0 | 1 | 5 | 10 | 0 | 0 | 0 | 0 | 0 |
| Flexibility | | A | A | A | A | A | A | A | A | A | A | A | A | B | B | B |
| Formability | Residual copper ratio: 20% | A | B | B | B | B | A | A | A | A | A | A | A | B | B | B |
| | Residual copper ratio: 50% | A | A | A | A | A | A | A | A | A | A | A | A | A | A | A |
| | Residual copper ratio: 80% | A | A | A | A | A | A | A | A | A | A | A | A | A | A | A |
| Thermal conductivity | W/m-K | 2.7 | 2.9 | 2.7 | 2.4 | 2.9 | 1.7 | 3.4 | 2.7 | 2.6 | 2.6 | 2.7 | 2.7 | 2.7 | 2.7 | 2.7 |
| Drillability (wear rate) | % | 47 | 47 | 47 | 50 | 44 | 42 | 50 | 47 | 45 | 42 | 47 | 47 | 44 | 47 | 47 |
| Heat resistance | — | B | B | B | B | B | B | B | B | B | B | B | B | A | B | B |

TABLE 4

| | | Comparative examples | | | | | | |
|---|---|---|---|---|---|---|---|---|
| | | 1 | 2 | 3 | 4 | 5 | 6 | 7 |
| Content of Component (B) in resin composition | % by volume | 70 | 70 | 70 | 70 | 70 | 55 | 80 |
| Content of Component (b1) in Component (B) | % by volume | 50 | 30 | 70 | 0 | 100 | 50 | 50 |
| Content of Component (b2) in Component (B) | % by volume | 50 | 70 | 30 | 100 | 0 | 50 | 50 |
| Content of Component (b3) in Component (B) | % by volume | 0 | 0 | 0 | 0 | 0 | 0 | 0 |
| Flexibility | | A | A | C | A | C | A | C |
| Formability | Residual copper ratio: 20% | A | B | B | A | B | A | B |
| | Residual copper ratio: 50% | A | A | B | A | B | A | B |
| | Residual copper ratio: 80% | A | A | B | A | B | A | B |
| Thermal conductivity | W/m-K | 2.5 | 2.4 | 3.0 | 1.9 | 3.4 | 1.4 | 4.6 |
| Drillability (wear rate) | % | 41 | 51 | 43 | 57 | 38 | 39 | 52 |
| Heat resistance | | C | B | B | B | B | B | B |

*The content of Component (b1) in Component (B) includes magnesium caronate (hydrate).

REFERENCE SIGNS LIST

1 Resin Film
10 Film
2 Sheet of Metal Foil with Resin
20 Resin Layer

21 Sheet of Metal Foil
3 Prepreg
30 Resin Layer
31 Base Member
4 Metal-Clad Laminate
40 Insulating Layer
41 Sheet of Metal Foil
5 Printed Wiring Board
50 Insulating Layer
51 Conductor Layer

The invention claimed is:

1. A resin composition comprising:
a resin as Component (A);
an inorganic filler as Component (B);
a curing agent; and
a catalyst,
the Component (B) including:
anhydrous magnesium carbonate as Component (b1);
aluminum oxide as Component (b2); and
as Component (b3), an inorganic substance on which a molybdenum compound is supported,
the Component (B) including substantially no hydrates of magnesium carbonate,
content of the Component (b1) falling within a range from 35% by volume to 65% by volume relative to 100% by volume of the Components (b1) and (b2) combined,
content of the Component (B) falling within a range from 60% by volume to 75% by volume relative to 100% by volume of the resin composition, and
content of the Component (b3) being 10% by volume or less relative to 100% by volume of the Components (b1), (b2), and (b3) combined, and
the catalyst including organic acid metal salts.

2. The resin composition of claim 1, wherein
the Component (b1) has a larger mean particle size than the Component (b2).

3. The resin composition of claim 1, wherein
the Component (b1) has a mean particle size falling within a range from 8 μm to 20 μm.

4. The resin composition of claim 1, wherein
the Component (b2) has a mean particle size of 1 μm or less.

5. The resin composition of claim 1, wherein
the Component (b2) has a rounded shape.

6. A resin film comprising a film including either the resin composition of claim 1 or a semi-cured product thereof.

7. A sheet of metal foil with resin, comprising:
a resin layer including either the resin composition of claim 1 or a semi-cured product thereof; and
a sheet of metal foil bonded to the resin layer.

8. A prepreg comprising:
a resin layer including either the resin composition of claim 1 or a semi-cured product thereof; and
a base member buried in the resin layer.

9. A metal-clad laminate comprising:
an insulating layer including a cured product of the resin composition of claim 1; and
a sheet of metal foil bonded to the insulating layer.

10. A printed wiring board comprising:
an insulating layer including a cured product of the resin composition of claim 1; and
a conductor layer bonded to the insulating layer.

11. The resin composition of claim 1, wherein
the Component (A) includes a thermosetting resin and/or a photocurable resin.

12. The resin composition of claim 1, wherein
the inorganic substance includes at least one selected from the group consisting of carbonates, metal oxides, silicates and metal hydroxides.

13. The resin composition of claim 1, wherein
the curing agent includes dicyandiamide.

14. The metal-clad laminate of claim 9, wherein
a thickness of the sheet of metal foil falls within a range from 12 μm to 420 μm.

15. The metal-clad laminate of claim 9, wherein
a ten-point average roughness Rzjis of the sheet of metal foil is 3 μm or more.

* * * * *